(12) United States Patent
Weidinger et al.

(10) Patent No.: US 11,523,520 B2
(45) Date of Patent: Dec. 6, 2022

(54) METHOD FOR MAKING CONTACT WITH A COMPONENT EMBEDDED IN A PRINTED CIRCUIT BOARD

(71) Applicant: AT&S Austria Technologie & Systemtechnik Aktiengesellschaft, Leoben (AT)

(72) Inventors: Gerald Weidinger, Leoben (AT); Andreas Zluc, Leoben (AT); Johannes Stahr, St. Lorenzen (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 57 days.

(21) Appl. No.: 16/184,470

(22) Filed: Nov. 8, 2018

(65) Prior Publication Data

US 2019/0082543 A1    Mar. 14, 2019

Related U.S. Application Data

(63) Continuation-in-part of application No. 15/122,114, filed as application No. PCT/AT2015/050052 on Feb. 26, 2015, now Pat. No. 10,187,997.

(30) Foreign Application Priority Data

Feb. 27, 2014  (AT) ................. A50152/2014

(51) Int. Cl.
   *H05K 3/46*      (2006.01)
   *H05K 1/18*      (2006.01)
   (Continued)

(52) U.S. Cl.
   CPC .............. *H05K 3/4644* (2013.01); *H05K 1/11* (2013.01); *H05K 1/186* (2013.01); *H05K 1/188* (2013.01);
   (Continued)

(58) Field of Classification Search
   CPC ...... H05K 1/188; H05K 3/4697; H05K 3/108; H05K 3/30; H05K 3/064; H05K 1/11;
   (Continued)

(56) References Cited

U.S. PATENT DOCUMENTS

| 4,931,134 A | 6/1990 | Hatkevitz et al. |
| 5,206,188 A | 4/1993 | Hiroi et al. |

(Continued)

FOREIGN PATENT DOCUMENTS

| AT | 13434 U1 | 12/2013 |
| CN | 100525591 C | 8/2009 |

(Continued)

OTHER PUBLICATIONS

Austrian Search Report for Application No. A 740/2012, Filing Date Jul. 7, 2012, Search Completed May 3, 2013, 2 pgs.
(Continued)

*Primary Examiner* — Minh N Trinh
(74) *Attorney, Agent, or Firm* — KPPB LLP

(57) ABSTRACT

The invention pertains to a method for the bonding of a component embedded into a printed circuit board exhibiting the following steps:
  Provision of a core exhibiting at least one insulating layer and at least one conductor layer applied to the insulating layer,
  Embedding of at least one component into a recess of the insulating layer, wherein the contacts of the component are essentially situated in the plane of an outer surface of the core exhibiting the at least one conductor layer,
  Application of a photoimageable resist onto the one outer surface of the core on which the component is arranged, while filling the spaces between the contacts of the component, (Continued)

Figure 1:
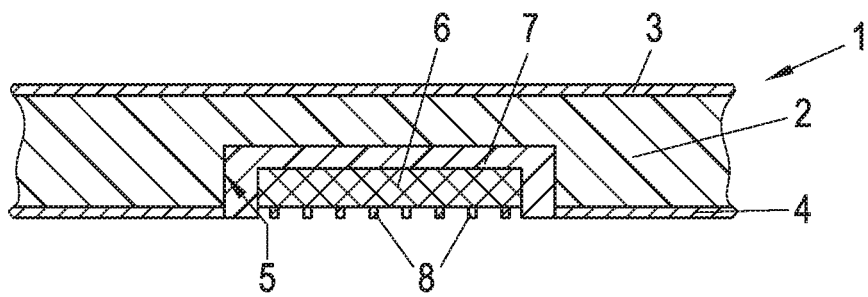

Clearing of end faces of the contacts and of the areas of the conductor layer covered by the photoimageable resist by exposing and developing the photoimageable resist, by application of a semi-additive process, deposition of a layer of conductor material onto the cleared end faces of the contacts and the cleared areas of the conductor layer and formation of a conductor pattern on at least the one outer surface of the core on which the component is arranged, as well as the interconnecting paths between the contacts and the conductor pattern, and Removal of the areas of the conductor layer not belonging to the conductor pattern.

25 Claims, 1 Drawing Sheet

(51) Int. Cl.
| | | |
|---|---|---|
| H05K 1/11 | (2006.01) | |
| H05K 3/06 | (2006.01) | |
| H05K 3/32 | (2006.01) | |
| H05K 3/26 | (2006.01) | |

(52) U.S. Cl.
CPC .............. H05K 3/06 (2013.01); H05K 3/26 (2013.01); H05K 3/32 (2013.01); *H05K 3/064* (2013.01); *H05K 2201/0154* (2013.01); *H05K 2201/09036* (2013.01)

(58) Field of Classification Search
CPC ........... H05K 1/186; H05K 2201/0154; H05K 2201/09036; H05K 3/06; H01L 23/13; H01L 23/5389; Y10T 29/4913; Y10T 29/49155; Y10T 29/49117; Y10T 29/49169
USPC .................................. 29/832, 846, 829, 852
See application file for complete search history.

(56) References Cited

U.S. PATENT DOCUMENTS

| | | | |
|---|---|---|---|
| 5,241,456 A | 8/1993 | Marcinkiewicz et al. | |
| 5,561,085 A * | 10/1996 | Gorowitz | H01L 23/5221 |
| | | | 257/E23.143 |
| 5,645,673 A | 7/1997 | Fasano et al. | |
| 5,730,635 A | 3/1998 | De Haas et al. | |
| 6,005,289 A | 12/1999 | Watanabe | |
| 6,120,693 A | 9/2000 | Petti et al. | |
| 6,163,049 A | 12/2000 | Bui | |
| 6,309,912 B1 * | 10/2001 | Chiou | H01L 21/52 |
| | | | 438/118 |
| 6,324,067 B1 | 11/2001 | Nishiyama | |
| 6,442,033 B1 | 8/2002 | Lu et al. | |
| 6,492,726 B1 | 12/2002 | Ang | |
| 6,506,632 B1 * | 1/2003 | Cheng | H01L 21/568 |
| | | | 257/E23.069 |
| 6,674,159 B1 | 1/2004 | Peterson | |
| 6,687,985 B2 | 2/2004 | Nishiyama | |
| 6,732,428 B1 | 5/2004 | Kwong | |
| 6,815,046 B2 | 11/2004 | Kumano | |
| 6,903,458 B1 * | 6/2005 | Nathan | H01L 23/49833 |
| | | | 257/737 |
| 6,919,508 B2 * | 7/2005 | Forcier | B81C 1/0023 |
| | | | 174/565 |
| 7,087,991 B2 * | 8/2006 | Chen | H01L 23/5389 |
| | | | 257/698 |
| 7,154,760 B2 | 12/2006 | Tsuchiya | |
| 7,282,394 B2 * | 10/2007 | Cho | H01L 24/82 |
| | | | 438/118 |
| 7,629,204 B2 * | 12/2009 | Hsu | H01L 23/5389 |
| | | | 257/E21.499 |
| 7,705,446 B2 * | 4/2010 | Chia | H01L 23/49816 |
| | | | 257/703 |
| 7,719,104 B2 * | 5/2010 | Hsu | H01L 23/5389 |
| | | | 257/699 |
| 7,863,735 B1 | 1/2011 | Cho et al. | |
| 7,894,203 B2 | 2/2011 | Tsuda | |
| 7,947,906 B2 * | 5/2011 | Lee | H05K 1/185 |
| | | | 174/252 |
| 7,977,579 B2 | 7/2011 | Bathan | |
| 8,049,114 B2 * | 11/2011 | Chen | H01L 23/49827 |
| | | | 174/257 |
| 8,101,868 B2 * | 1/2012 | Ito | H01L 23/5385 |
| | | | 174/260 |
| 8,130,507 B2 * | 3/2012 | Origuchi | H05K 1/185 |
| | | | 361/760 |
| 8,186,045 B2 * | 5/2012 | Sakamoto | H01L 21/4846 |
| | | | 174/260 |
| 8,217,509 B2 * | 7/2012 | Horiuchi | H01L 23/5389 |
| | | | 257/692 |
| 8,320,135 B2 * | 11/2012 | Ito | H01L 23/49822 |
| | | | 361/763 |
| 8,354,743 B2 | 1/2013 | Jensen | |
| 8,381,394 B2 | 2/2013 | Shizuno | |
| 8,400,776 B2 | 3/2013 | Sahara et al. | |
| 8,547,701 B2 * | 10/2013 | Tuominen | H01L 23/5389 |
| | | | 174/250 |
| 8,563,358 B2 * | 10/2013 | Landesberger | H01L 23/3121 |
| | | | 438/106 |
| 8,642,465 B2 | 2/2014 | Schimetta et al. | |
| 8,736,065 B2 * | 5/2014 | Gonzalez | H01L 24/19 |
| | | | 257/774 |
| 8,785,788 B2 * | 7/2014 | Shimizu | H01L 23/5389 |
| | | | 174/260 |
| 8,789,271 B2 | 7/2014 | Zluc et al. | |
| 8,829,357 B2 * | 9/2014 | Mikado | H05K 1/185 |
| | | | 174/260 |
| 8,914,974 B2 | 12/2014 | Lenhardt et al. | |
| 9,159,693 B2 * | 10/2015 | Choi | H01L 24/80 |
| 9,179,553 B2 * | 11/2015 | Suzuki | H05K 3/284 |
| 9,418,930 B2 | 8/2016 | Stahr et al. | |
| 9,560,769 B2 * | 1/2017 | Shimabe | H05K 1/032 |
| 9,648,758 B2 | 5/2017 | Gotzinger et al. | |
| 9,713,248 B2 | 7/2017 | Langer et al. | |
| 9,763,337 B2 | 9/2017 | Jager et al. | |
| 9,781,845 B2 | 10/2017 | Stahr et al. | |
| 9,820,381 B2 | 11/2017 | Wang et al. | |
| 10,187,997 B2 * | 1/2019 | Weidinger | H01L 23/13 |
| 10,219,384 B2 | 2/2019 | Stahr et al. | |
| 10,779,413 B2 | 9/2020 | Schwarz et al. | |
| 11,172,576 B2 | 11/2021 | Stahr et al. | |
| 2002/0036100 A1 | 3/2002 | Slemmons et al. | |
| 2003/0015342 A1 * | 1/2003 | Sakamoto | H01L 21/4846 |
| | | | 174/250 |
| 2003/0090883 A1 | 5/2003 | Asahi et al. | |
| 2004/0014317 A1 * | 1/2004 | Sakamoto | H01L 23/49838 |
| | | | 438/689 |
| 2004/0114652 A1 | 6/2004 | Yoshikawa | |
| 2004/0168825 A1 | 9/2004 | Sakamoto et al. | |
| 2004/0170766 A1 | 9/2004 | Inoue et al. | |
| 2004/0233650 A1 | 11/2004 | Miyashita et al. | |
| 2005/0017347 A1 * | 1/2005 | Morimoto | H01L 23/5389 |
| | | | 257/703 |
| 2005/0048759 A1 * | 3/2005 | Hsu | H01L 24/24 |
| | | | 438/618 |
| 2005/0103522 A1 | 5/2005 | Grundy et al. | |
| 2005/0189640 A1 | 9/2005 | Grundy et al. | |
| 2005/0190537 A1 | 9/2005 | Rossi et al. | |
| 2005/0233122 A1 | 10/2005 | Nishimura et al. | |
| 2006/0008970 A1 | 1/2006 | Oggioni et al. | |
| 2006/0049530 A1 | 3/2006 | Hsu et al. | |
| 2006/0101638 A1 | 5/2006 | Germann et al. | |
| 2006/0120056 A1 | 6/2006 | Sasaki | |
| 2006/0193108 A1 | 8/2006 | Usui et al. | |
| 2006/0198570 A1 * | 9/2006 | Ogawa | G02B 6/12002 |
| | | | 385/14 |

(56) References Cited

U.S. PATENT DOCUMENTS

| | | |
|---|---|---|
| 2006/0222285 A1 | 10/2006 | Minamio et al. |
| 2006/0231950 A1* | 10/2006 | Yoon .................. H01L 23/3114 257/737 |
| 2006/0278967 A1* | 12/2006 | Tuominen .............. H01L 24/19 257/686 |
| 2007/0069352 A1* | 3/2007 | Ho ........................ H01L 23/3735 257/678 |
| 2007/0131349 A1* | 6/2007 | Tuominen ........... H01L 23/5389 156/280 |
| 2007/0166886 A1* | 7/2007 | Iihola .................. H01L 23/5389 438/125 |
| 2008/0067666 A1 | 3/2008 | Hsu |
| 2008/0192443 A1 | 8/2008 | Hatanaka et al. |
| 2008/0192450 A1 | 8/2008 | Tuominen et al. |
| 2008/0196931 A1 | 8/2008 | Lee et al. |
| 2008/0202801 A1* | 8/2008 | Tuominen ........... H01L 21/4846 174/260 |
| 2008/0264687 A1 | 10/2008 | Park et al. |
| 2008/0283491 A1 | 11/2008 | Arai et al. |
| 2008/0296056 A1 | 12/2008 | Kinoshita et al. |
| 2009/0001609 A1 | 1/2009 | Lim |
| 2009/0014749 A1 | 1/2009 | Matsuda et al. |
| 2009/0026168 A1 | 1/2009 | Tsai et al. |
| 2009/0194318 A1 | 8/2009 | Yeon et al. |
| 2009/0205859 A1 | 8/2009 | Tanaka et al. |
| 2009/0241333 A1 | 10/2009 | He et al. |
| 2009/0277673 A1 | 11/2009 | Sohn et al. |
| 2009/0293271 A1 | 12/2009 | Tanaka |
| 2010/0018761 A1* | 1/2010 | Wang .................. H01L 23/5389 174/260 |
| 2010/0019368 A1* | 1/2010 | Shin ........................ H01L 23/24 257/686 |
| 2010/0084175 A1 | 4/2010 | Suzuki et al. |
| 2010/0170703 A1 | 7/2010 | Iihola et al. |
| 2010/0252303 A1 | 10/2010 | Chang et al. |
| 2010/0282498 A1 | 11/2010 | Tezak et al. |
| 2011/0089531 A1* | 4/2011 | Hillman .............. H01L 23/5389 257/532 |
| 2011/0127076 A1 | 6/2011 | Jeong et al. |
| 2011/0127675 A1 | 6/2011 | Ewe et al. |
| 2011/0183093 A1 | 7/2011 | Wada |
| 2011/0198018 A1 | 8/2011 | Schrittwieser et al. |
| 2011/0203836 A1 | 8/2011 | Yokota et al. |
| 2011/0212274 A1 | 9/2011 | Selsley et al. |
| 2011/0215464 A1* | 9/2011 | Guzek .................. H01L 21/568 257/737 |
| 2011/0259630 A1 | 10/2011 | Park |
| 2011/0272177 A1 | 11/2011 | Weichslberger et al. |
| 2011/0284267 A1 | 11/2011 | Chang |
| 2011/0290408 A1* | 12/2011 | Samejima .............. H05K 3/462 156/182 |
| 2011/0290546 A1 | 12/2011 | Lee et al. |
| 2011/0304998 A1 | 12/2011 | Lin |
| 2011/0317381 A1 | 12/2011 | Kim et al. |
| 2012/0048605 A1 | 3/2012 | Chung |
| 2012/0091594 A1 | 4/2012 | Landesberger et al. |
| 2012/0153493 A1* | 6/2012 | Lee ........................ H01L 25/16 257/774 |
| 2012/0181074 A1 | 7/2012 | Ishihara et al. |
| 2012/0247819 A1* | 10/2012 | Tsuyutani .............. H01L 24/82 174/257 |
| 2013/0146991 A1 | 6/2013 | Otremba et al. |
| 2013/0153269 A1 | 6/2013 | Takahashi et al. |
| 2013/0256884 A1 | 10/2013 | Meyer |
| 2014/0000941 A1 | 1/2014 | Weidinger et al. |
| 2014/0120291 A1* | 5/2014 | Kim ........................ H05K 3/30 428/41.5 |
| 2014/0227834 A1* | 8/2014 | Karpman ................ H01L 24/80 438/126 |
| 2014/0254119 A1 | 9/2014 | Im |
| 2015/0007934 A1 | 1/2015 | Götzinger et al. |
| 2015/0157862 A1 | 6/2015 | Greenberg et al. |
| 2015/0189763 A1 | 7/2015 | Schrittwieser |
| 2015/0334833 A1 | 11/2015 | Wang et al. |
| 2015/0334841 A1 | 11/2015 | Schmid et al. |
| 2015/0334844 A1* | 11/2015 | Shimabe ................ H05K 1/032 361/761 |
| 2015/0342062 A1 | 11/2015 | Jäger et al. |
| 2016/0021763 A1 | 1/2016 | Stahr et al. |
| 2016/0133558 A1 | 5/2016 | Stahr et al. |
| 2016/0324004 A1 | 11/2016 | Schwarz et al. |
| 2016/0353566 A1 | 12/2016 | Ianger et al. |
| 2017/0034923 A1* | 2/2017 | Lin ........................ H05K 3/4038 |
| 2017/0048984 A1 | 2/2017 | Weidinger et al. |
| 2017/0164481 A1 | 6/2017 | Stahr et al. |
| 2019/0082543 A1* | 3/2019 | Weidinger ............... H05K 3/06 |
| 2019/0150288 A1 | 5/2019 | Stahr et al. |
| 2020/0323081 A1 | 10/2020 | Schwarz et al. |

FOREIGN PATENT DOCUMENTS

| | | |
|---|---|---|
| CN | 102293070 A | 12/2011 |
| CN | 103199069 A | 7/2013 |
| CN | 203072246 U | 7/2013 |
| DE | 19642488 A1 | 4/1998 |
| DE | 20021698 U1 | 4/2001 |
| DE | 20221189 U1 | 6/2005 |
| DE | 102006009723 A1 | 9/2007 |
| DE | 102008025223 A1 | 12/2008 |
| DE | 102008040906 A1 | 2/2010 |
| DE | 102010042567 B3 | 3/2012 |
| EP | 195935 A2 | 10/1986 |
| EP | 275433 A1 | 7/1988 |
| EP | 1225629 A2 | 7/2002 |
| EP | 1304742 A2 | 4/2003 |
| EP | 1424731 A2 | 6/2004 |
| EP | 2119327 B1 | 10/2011 |
| FR | 2822338 A1 | 9/2002 |
| GB | 2485087 A | 5/2012 |
| JP | 11150368 A | 6/1999 |
| JP | 2003031914 A | 1/2003 |
| JP | 2003198133 A | 7/2003 |
| JP | 2004031682 A | 1/2004 |
| JP | 2005333109 A | 12/2005 |
| JP | 2007189006 A | 7/2007 |
| JP | 2007318090 A | 12/2007 |
| JP | 2010206124 A | 9/2010 |
| JP | 2011138873 A | 7/2011 |
| JP | 2012044102 A | 3/2012 |
| JP | 2012151359 A | 8/2012 |
| KR | 101253514 B1 | 4/2013 |
| WO | 199820530 A1 | 5/1998 |
| WO | 2003092344 A1 | 11/2003 |
| WO | 2005020651 A1 | 3/2005 |
| WO | 2005104636 A1 | 11/2005 |
| WO | 2006013230 A2 | 2/2006 |
| WO | 2006134217 A1 | 12/2006 |
| WO | 2007087660 A1 | 8/2007 |
| WO | 2008098271 A1 | 8/2008 |
| WO | 2008104324 A1 | 9/2008 |
| WO | 2009143550 A1 | 12/2009 |
| WO | 2010048654 A1 | 5/2010 |
| WO | 2010085830 A1 | 8/2010 |
| WO | 2011088489 A1 | 7/2011 |
| WO | 2011099820 A2 | 8/2011 |
| WO | 2012016258 A2 | 2/2012 |
| WO | 2012065202 A1 | 5/2012 |
| WO | 2012100274 A1 | 8/2012 |
| WO | 2013029073 A1 | 3/2013 |
| WO | 2013029074 A1 | 3/2013 |
| WO | 2014131071 A2 | 9/2014 |
| WO | 2014197917 A1 | 12/2014 |
| WO | 2015077808 A1 | 6/2015 |
| WO | 2015085342 A1 | 6/2015 |
| WO | 2015113088 | 8/2015 |
| WO | 2015127489 | 9/2015 |

OTHER PUBLICATIONS

International Preliminary Report on Patentability for International Application No. PCT/AT2013/000029, Report dated Aug. 26, 2014, dated Sep. 4, 2014, 13 Pgs.

(56) References Cited

OTHER PUBLICATIONS

International Preliminary Report on Patentability for International Application No. PCT/AT2013/050128, Report completed Sep. 16, 2014, 11 Pgs.
International Preliminary Report on Patentability for International Application No. PCT/AT2013/050249, Report dated Jun. 30, 2015, dated Jul. 9, 2015, 6 Pgs.
International Preliminary Report on Patentability for International Application No. PCT/AT2013/050260, Report dated Mar. 27, 2015, dated Mar. 27, 2015, 8 Pgs.
International Preliminary Report on Patentability for International Application No. PCT/AT2013/050262, Report dated Mar. 11, 2015, dated Mar. 11, 2015, 14 Pgs.
International Preliminary Report on Patentability for International Application No. PCT/AT2014/050239, Report dated Mar. 1, 2016, dated Jun. 1, 2016, 9 Pgs.
International Preliminary Report on Patentability for International Application PCT/AT2014/050044, Report Completed Jun. 23, 2015, dated Jun. 23, 2015, 18 Pgs.
International Preliminary Report on Patentability for International Application PCT/AT2014/050113, Report dated Aug. 28, 2015, dated Aug. 28, 2015, 8 Pgs.
International Preliminary Report on Patentability for International Application PCT/AT2014/050300, Report dated Oct. 10, 2015, dated Mar. 23, 2016, 9 Pgs.
International Preliminary Report on Patentability for International Application PCT/AT2015/050019, Report dated Aug. 2, 2016, dated Aug. 11, 2016, 8 Pgs.
International Preliminary Report on Patentability for International Application PCT/AT2015/050052, Report dated Jun. 6, 2016, dated Dec. 23, 2015, 16 Pgs.
International Search Report for International Application No. PCT/AT2014/050300, Search completed Mar. 13, 2015, dated Mar. 23, 2015, 3 Pgs.
International Search Report and Written Opinion for International Application No. PCT/AT2013/050262, Search completed Mar. 18, 2014, dated Mar. 27, 2014, 9 Pgs.
International Search Report and Written Opinion for International Application No. PCT/AT2014/050044, Search completed May 9, 2014, dated May 20, 2014, 9 Pgs.
International Search Report and Written Opinion for International Application No. PCT/AT2014/050239, Search completed Feb. 2, 2015, dated Feb. 9, 2015, 8 Pgs.
International Search Report and Written Opinion for International Application No. PCT/AT2015/050019, Search completed Apr. 23, 2015, dated May 27, 2015, 9 Pgs.
International Search Report and Written Opinion for International Application No. PCT/AT2015/050052, Search completed May 26, 2015, dated Jun. 2, 2015, 10 Pgs.
International Search Report for International Application No. PCT/AT2013/050128, International Filing Date Jun. 25, 2013, Search Completed Oct. 23, 2013, dated Nov. 26, 2013, 6 pgs.
International Search Report for International Application No. PCT/AT2013/050249, Search completed Apr. 1, 2014, dated Sep. 4, 2014, 4 Pgs.
International Search Report for International Application No. PCT/AT2013/050260, Search completed Apr. 29, 2014, dated May 13, 2014, 4 Pgs.
International Search Report for International Application PCT/AT2013/000029, completed May 31, 2013, dated Jun. 7, 2013, 6 pgs.
International Search Report for International Application PCT/AT2014/050113, Report completed Aug. 22, 2014, dated Aug. 28, 2014, 3 Pgs.
Written Opinion for International Application No. PCT/AT2013/050128, Search Completed Oct. 23, 2013, dated Nov. 26, 2013, 5 pgs.
Written Opinion for International Application No. PCT/AT2013/050249, Search completed Apr. 1, 2014, dated Sep. 4, 2014, 5 Pgs.
Written Opinion for International Application No. PCT/AT2013/050260, Search completed Apr. 29, 2014, dated May 13, 2014, 4 Pgs.
Written Opinion for International Application No. PCT/AT2014/050300, Search completed Mar. 13, 2015, dated Mar. 23, 2015, 7 Pgs.
Written Opinion for International Application PCT/AT2013/000029, completed May 31, 2013, dated Jun. 7, 2013, 5 pgs.
Written Opinion for International Application PCT/AT2014/050113, Report completed Aug. 22, 2014, dated Aug. 28, 2014, 6 Pgs.
Charboneau, B C et al., "Double-Sided Liquid Cooling for Power Semiconductor Devices Using Embedded Power Packaging", IEEE Transactions on Industry Applications, IEEE Service Center, vol. 44, No. 5, Sep. 1, 2008, pp. 1645-1655, XP011446042, ISSN: 0093-994, DOI: 10.1109/TIA.2008.2002270.
Mital et al.,, "Thermal Design Methodology for an Embedded Power Electronic Module Using Double-Sided Microchannel Cooling", Journal of Electric Packaging, ASME International, US, vol. 130, No. 3, Sep. 1, 2008, XP008171354, DOI: 10.1115/1.2957320, Retrieved on Jul. 29, 2008.
Pang, Y et al., "Assessment of Some Integrated Cooling Mechanisms for an Active Integrated Power Electronics Module", Journal of Electronic Packaging, ASME International, US, vol. 129, No. 1, Mar. 1, 2007, pp. 1-8, XP008171355, ISSN: 1 043-7398, DOI: 1 0.1115/1.2429703.
Yin, "High Temperature SiC Embedded Chip Module (ECM) with Double-sided Metallization Structure", Jan. 3, 2006, XP055135318, Gefunden im Internet: URL:http://hdl.handle.net/ 10919/30076 (presented in 2 parts).

\* cited by examiner

METHOD FOR MAKING CONTACT WITH A COMPONENT EMBEDDED IN A PRINTED CIRCUIT BOARD

This application is a continuation in part of U.S. patent application Ser. No. 15/122,114, filed Aug. 26, 2016, which is a U.S. national stage of PCT Application No. PCT/AT2015/050052, filed Feb. 26, 2015, which claims priority to Austrian Application No. A50152/2014, filed Feb. 27, 2014, the disclosures of which are incorporated by reference herein in their entirety.

The invention pertains to a method for the bonding of a component embedded in a printed circuit board.

The invention furthermore pertains to a printed circuit board with at least one insulated layer and at least one structured conductor layer with conductor paths, with at least one component, which, by means of an adhesive layer, is embedded into a recess of the printed circuit board, with its contacts essentially being situated in the plane of an outer surface of the printed circuit board exhibiting the at least one conductor layer, and with conductive connections between the contacts of the components and the conductor paths of the conductor layer.

The embedding of components, in particular of semiconductor chips, in printed circuit board structures is familiar to the professional, wherein within the scope of the invention, structures are contemplated in which the contacts of the component are essentially situated within one plane at the outer surface of the printed circuit board, also called "surface embedded components". The electrical contacts of the component must be bonded with a conductor pattern, for which various methods have been applied.

DE 10 2006 009 723 A1, for example, describes a method of embedding a component in a circuit board and of its contacts, in which a first insulating layer with a conductor pattern is applied to a metallic substrate. This is followed by the creation of a window or cut-out for the chip in the first layer, into which the chip—while leaving a gap—is inserted and, using an adhesive, is fixated to the substrate. In doing so, the contacts of the chip are situated on a bonding side facing away from the substrate. Applied on top of this configuration is a photoimageable second insulating layer, which leaves the contact points of the chip cleared, followed by electrical bonding by means of galvanic deposition of a conductor material between the contacts of the chip and the conductor pattern on the first layer. The known method and the resulting product have the disadvantage that in the spacing area between the chip and the adjacent layers a cavity remains, which during the buildup of additional layers may lead to delamination issues.

One objective of this invention is to establish a method with the use of which a conductor pattern in the plane of the contacts, including the respective bondings, can be produced easily and cost-efficiently without the risk of detaching layers.

This objective is achieved with a method of the type referred to above, which according to the invention exhibits the following steps:

a) Provision of a core exhibiting at least one insulating layer and at least one conductor layer applied to the insulating layer, b) Embedding of at least one component into a recess of the insulating layer, wherein the contacts of the component are essentially situated within the plane of an outer surface of the printed circuit board exhibiting the at least one conductor layer, c) Application of a photoimageable lacquer on the one outer surface of the core on which the component is arranged while filling the spaces between the contacts of the component, d) Clearing of end faces of the contacts and of the regions covered by the photoimageable lacquer of the conductor layer by means of exposing and developing the photoimageable lacquer, e) using a semi-additive process, deposition of conductor material onto the cleared end faces of the contacts and the cleared regions of the conductor layer and forming of a conductor pattern at least on the one outer surface of the core on which the component is arranged, was well as the interconnecting paths between the contacts and the conductor pattern, and f) Removal of the sections of the conductor layer not belonging to the conductor pattern.

Thanks to the invention, embedded components can be "wired" in the same position or plane as the embedding, such that the printed circuit boards can be designed to be thinner and the aforementioned problems of the risk of detachment do not arise.

In doing so, it is recommended for the removal of the sections of the conductor layer in step f) is carried out by flash-etching.

Regarding the additional function of the photoimageable lacquer as a part of the finished printed circuit board, it is advantageous for the photoimageable lacquer used in step c) to be epoxy-based lacquer.

In a particularly advantageous variation of the method according to the invention it may be provided that in step b) the component is embedded into an recess of the core using an adhesive layer, wherein the adhesive layer fully envelops all surfaces of the component—with the exception of those with the contacts—and essentially extends to the plane of the surface of the printed circuit board in which the end faces of the contacts are situated.

In a particularly expedient manner, the recess of the core extends through the conductor layer into the insulating layer.

The stated objectives will also be achieved with a printed circuit board of the above stated type, in which according to the present invention the connections and the conductor paths of the conductor layer are situated in one plane, where the adhesive layer completely envelops all surfaces of the component, except those with the contacts, where the spaces between the contacts of the component are filled with a cured, photoimageable lacquer, and an additional conductor layer is applied to the end faces of the contacts as well as to a conductor layer of the printed circuit board in the area of the conductor paths.

In a preferred embodiment, it is provided that the cured, photoimageable lacquer covers the cleared end faces of the adhesive layer between the outer wall of the component and the inner wall of the recess of the printed circuit board.

In one advanced embodiment of the invention, the printed circuit board again comprises a core exhibiting at least one insulating layer and at least one conductor layer having been applied to the insulating layer, wherein one outer surface of the core having been provided with at least one conductor layer exhibits a recess which extends through the conductor layer into the insulating layer, whereby the component is embedded into the recess of the core by means of an adhesive layer, and wherein the contacts of the component are essentially situated in the plane of the outer surface exhibiting the at least one conductor layer and the recess.

The invention and its further advantages is described in greater detail below based on a sample embodiment of the method and the circuit board, which is illustrated in the drawing. In this drawing show FIG. 1 in a section through a partial section a core made in the first steps of the method with an embedded component, FIG. 2 the structure of FIG. 1 after application of a photoimageable lacquer, FIG. 3 the structure after exposure and development of the photoimageable lacquer, FIG. 4 the structure after deposition of additional conductive material by application of a semi-additive process and FIG. 5 the structure of the finished printed circuit board after part of the conductive coatings have been etched away.

The method according to the invention and the inventive printed circuit board will now be explained in reference to the figures. Therein, the term "core" used in the following in the context of the representational description shall be understood to mean a cured prepreg with a conductor layer (copper layer) on at least one surface.

FIG. 1 shows a section of a core 1 consisting of an insulating layer 2, for example consisting of a prepreg material commonly used in the printed circuit board industry, like FR 4, and an upper conductor layer 3 as well as a lower conductor layer 4. At this point it shall be noted that the terms "upper" and "lower" refer to the representation in the drawings only, and are being used for an easier description. Layer thicknesses, for example, are 100 microns for the insulating layer 2 and 1 to 5 microns, typically 2 microns, for upper and lower conductor layer 3 and 4 respectively.

In the core 1, a recess 5 is formed, into which—using an adhesive layer 7—a component 6 is embedded, whereby the layer thickness of this adhesive layer, for example, is 20 to 200 microns. The component 6, a semiconductor chip, for example, carries on an outer surface contacts 8, e.g. copper pads, whereby the adhesive layer 7 envelops all surfaces of the component 6 with the exception of those with the contacts 8, and essentially extends to the plane of the surface of the core 1, in which the end faces of the contacts 8 are situated, in this case, therefore the bottom surface. One possible adhesive, for example, is a solvent-free or low-solvent epoxy resin adhesive with a glass softening point of typically between 120° and 150° C., which will be pressed, filled or injected into the recess 5. After placement of the component 6, this adhesive will be hardened at temperatures of 110° to 150° C.

Figure 2:
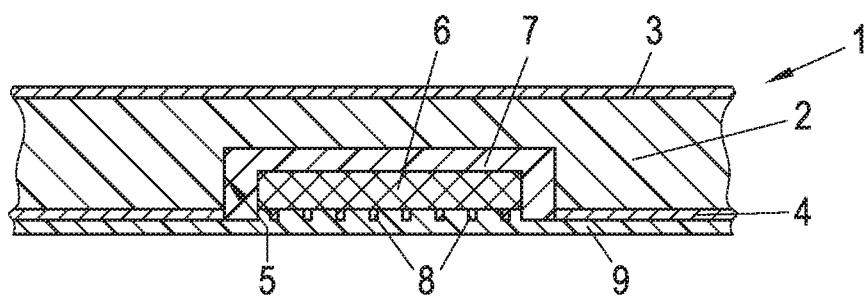
Figure 3:
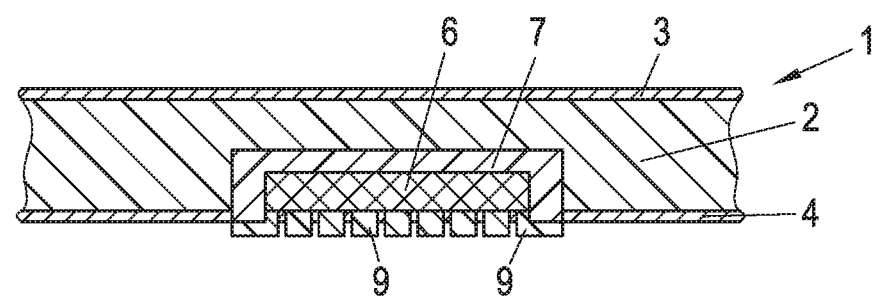

In a next step, an epoxy-based photoimageable resist 9 is applied at least to the outer surface of the core 1 with the end faces of the contacts 8, with reference being made to FIG. 2. Examples of products and materials suitable for this purpose are the XB7081 lacquer with the trade name Probelec® of the Huntsman Co. or the photoresist SU-8 from Microchem® Corp known from lithographic galvanoplasty (LIGA). As can be seen, the resist 9 is filling all spaces between the contacts 8 of the component 6, and also extends across the lower conductor layer 4.

Thereafter, a photolithographic process commonly used in printed circuit board manufacturing can be used to create the pattern (structuring), starting with exposure using film masking or LDI (Laser Direct Imaging). This is followed by development, obtainment of the patterns after washing-off with suitable chemicals, and the complete curing of the material. Curing is performed by means of conventional curing methods like thermal curing, UV- or IR-curing, application of laser radiation etc. The structuring and the exposure is performed in such manner that the contacts 8, more specifically their end faces, will be cleared, for which purpose reference is made to FIG. 3. This structuring/imaging process is performed such that the cured, photoimageable resist 9 covers the clear end faces of the adhesive layer 7 between the outer wall of the component 6 and the inner wall of the recess 5 of the core 1, and that the lower conductor layer 4 is cleared again.

Figure 4:
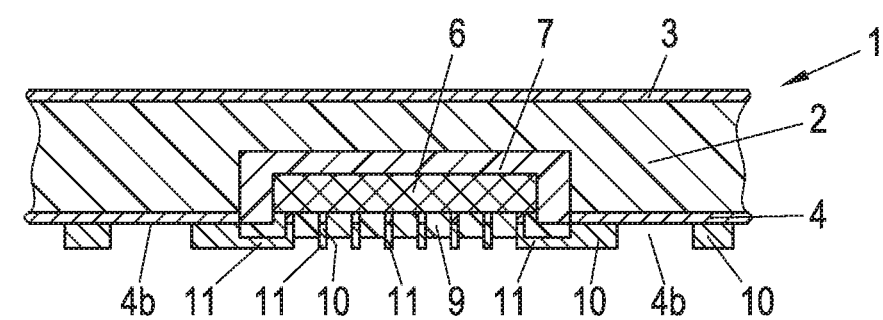
Figure 5:
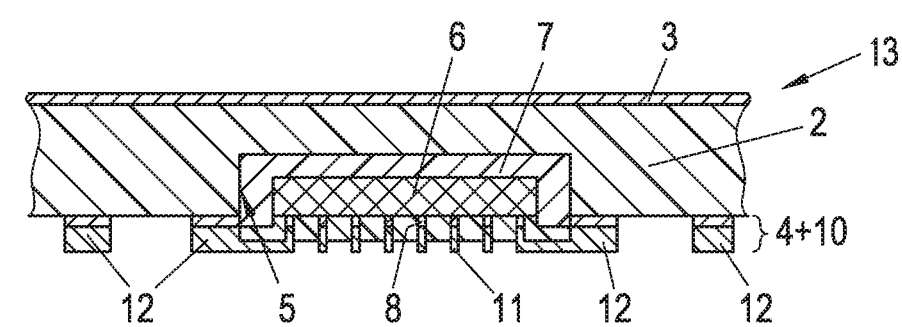

After this exposure and development, a semi-additive process for applying conductor material, among others, copper is applied according to the desired pattern. In doing so, a layer 10 of conductor material is applied in the desired areas, in particular for conductor paths, which is deposited also under formation of interconnecting paths 11 starting at the end faces 8 to the desired conductor pattern. The lower conductor layer 4, on the other hand, is amplified in the area of the desired conductor paths or conductor pattern. This result is shown in FIG. 4.

Since bridges 4b continue to exist between the thickened sections of the lower conductor layer 4 through layer 10, which are to form the conductor paths, these bridges 4b and any other undesirable conductor material is removed in an additional step. This is preferably done using so-called "flash etching", meaning the etching-off of the base copper foil and low-grade removal of the galvanically deposited copper layers. This etching process is performed, for example, with an acidic medium, e.g. HCl with the addition of $H_2O_2$ and of stabilizers, wherein the small crystallites of the base film are dissolved significantly faster than the electro-deposited layers, and selective etching is achieved. After this process of removing and etching, the surfaces and spaces between the contacts 9 are cleaned as well and the final conductor paths 12 have emerged and are completely formed, as referenced in FIG. 5, which shows the finished printed circuit board 13 with the embedded and bonded component 6.

In the example shown, only the structuring of the lower conductor layer 4 is described, but it should be clear that the upper conductor layer 3 may also be patterned in the same way. Also possible is the formation of vias (conductive feed-throughs) between the two conductor layers, just as additional insulating and conductor layers may be formed.

Finally, it should be understood that the representations in FIGS. 1 to 5 generally only show detail sections of a larger printed circuit board pattern, and that in practice, a plurality of components may be embedded and connected to conductor patterns at different locations on a printed circuit board.

What is claimed is:

1. A method of bonding of a component embedded into a printed circuit board, characterized by the following steps:
   providing a core exhibiting at least one insulating layer and at least one conductive layer applied to the insulating layer and defining an outer layer of the core,
   after providing the core, forming a recess in at least the insulating layer of the core,
   after forming the recess in at least the insulating layer of the core, embedding at least one component into the formed recess of the insulating layer by applying an adhesive layer to the formed recess, the at least one component having a plurality of contacts separated by a plurality of spaces, each of the plurality of contacts having an end face distal from the at least one component, wherein the plurality of contacts are configured to be positioned substantially perpendicular to a plane formed by the at least one outer surface of the core,
   depositing a layer of conductive material onto the end faces of the contacts and the conductive layer, and forming a conductor pattern on at least one outer surface of the core, and a plurality of interconnecting paths between the plurality of contacts and the conductor pattern; and removing portions of the at least one conductive layer that are disposed between the plurality of contacts of the at least one component and the conductor pattern such that a portion of the at least one conductive layer is not incorporated into the conductor pattern.

2. The method according to claim 1, comprising the further steps of:

applying a resist onto the at least one outer surface of the core and the component such that the spaces between each of the plurality of contacts of the component are filled by the resist.

3. The method according to claim 2, comprising the further step of:

clearing the resist from the end faces of the contacts and the at least one conductive layer by exposing and developing the resist, wherein the layer of conductive material is deposited onto the cleared end faces of the contacts and the conductive layer.

4. The method according to claim 2, wherein the applied resist comprises at least one of a photoimageable resist, an epoxy-based lacquer, a photoimageable resist, and polyimide.

5. The method according to claim 2, wherein the resists covers a part of the component and a part of the at least one conductive layer.

6. The method according to claim 1, wherein the end face of each of the contacts is on a retracted position with respect to an outer surface of the component.

7. The method according to claim 1, wherein the conductor pattern and the plurality of interconnecting paths are formed by one of a subtractive process, an additive process and a semi-additive process.

8. The method according to claim 1, further comprising a step of:

adding at least one further conductive layer onto the layer of conductive material.

9. The method according to claim 1, wherein the removal of the areas of the at least one conductive layer occurs by flash-etching.

10. The method according to claim 1, wherein the embedding of the at least one component further comprises applying an adhesive layer into the recess of the core such that the adhesive layer fully encloses all surfaces of the component, except for the surface of the component from which the plurality of contacts extend, the adhesive layer extending substantially to the plane of the core.

11. The method according to claim 10, wherein the recess of the core extends through the at least one conductive layer into the insulating layer.

12. The method according to claim 10, wherein the adhesive layer comprises at least one of a solvent-free adhesive, a low-solvent adhesive and a prepreg adhesive.

13. The method according to claim 1, wherein the contacts of the component are essentially situated in the plane of the at least one outer surface of the core exhibiting the at least one conductive layer.

14. The method according to claim 1, wherein after embedding the at least one component into the recess, applying a photoimageable resist at least to an outer surface of the core with the end faces of the contacts, and structuring the photoimageable resist in such manner that the end faces are cleared.

15. A method of bonding of a component embedded into a printed circuit board, characterized by the following steps:

providing a core exhibiting at least one insulating layer, after providing the core, forming a recess in at least the insulating layer of the core, after forming the recess in at least the insulating layer of the core, embedding at least one component into the formed recess of the insulating layer by applying an adhesive layer to the formed recess, the at least one component having a plurality of contacts separated by a plurality of spaces, each of the plurality of contacts having an end face distal from the at least one component, wherein the plurality of contacts are configured to be positioned substantially perpendicular to a plane formed by the at least one outer surface of the core, sputtering a conductive layer onto the insulating layer, wherein the sputtered conductive layer defining an outer layer of the core, and depositing at least one layer of conductive material onto the end faces of the contacts and the sputtered conductive layer, and forming a conductor pattern on at least one outer surface of the core, and a plurality of interconnecting paths between the plurality of contacts and the conductor pattern; and removing portions of the sputtered conductive layer that are disposed between the plurality of contacts of the at least one component and the conductor pattern such that a portion of the sputtered conductive layer is not incorporated into the conductor pattern.

16. The method according to claim 15, wherein the plurality of contacts are configured to be positioned substantially perpendicular to a plane formed by an outer surface of the core.

17. The method according to claim 15, further comprising the steps of:

applying a resist onto the at least one outer surface of the core and/or the component such that the spaces between each of the plurality of contacts of the component are filled by the resist.

18. The method according to claim 17, further comprising a step of:

clearing end faces of the contacts by exposing and developing the resist, wherein the layer of conductive material is deposited onto the cleared end faces of the contacts and the sputtered conductive layer.

19. The method according to claim 17, wherein the applied resist comprises at least one of a photoimageable resist, an epoxy-based lacquer, a photoimageable resist, and polyimide.

20. The method according to claim 15, wherein the removal of the areas of the sputtered conductive layer occurs by flash-etching.

21. The method according to claim 15, wherein the embedding of the at least one component further comprises applying an adhesive layer into the recess of the core such that the adhesive layer fully encloses all surfaces of the component, except for the surface of the component from which the plurality of contacts extend, the adhesive layer extending substantially to the plane of the core.

22. The method according to claim 15, wherein the recess of the core extends through the sputtered conductive layer into the insulating layer.

23. The method according to claim 15, wherein the resists covers a part of the component and a part of the sputtered conductive layer.

24. The method according to claim 15, wherein the contacts of the component are essentially situated in the plane of an outer surface of the core exhibiting the sputtered conductive layer.

25. The method according to claim 15, wherein
- after embedding the at least one component into the recess, applying a photoimageable resist at least to an outer surface of the core with the end faces of the contacts, and
- structuring the photoimageable resist in such manner that the end faces are cleared.

* * * * *